United States Patent [19]
Zavracky et al.

[11] Patent Number: 5,034,199

[45] Date of Patent: Jul. 23, 1991

[54] ZONE MELT RECRYSTALLIZATION APPARATUS

[75] Inventors: Paul M. Zavracky, Norwood; Kevin J. O'Connos, So. Easton, both of Mass.

[73] Assignee: Kopin Corporation, Taunton, Mass.

[21] Appl. No.: 120,015

[22] Filed: Nov. 13, 1987

[51] Int. Cl.$^5$ .............................................. C30B 13/32
[52] U.S. Cl. ..................................... 422/245; 422/250; 422/251; 432/231; 219/405; 219/411; 373/139
[58] Field of Search ....................... 422/245, 250, 251; 432/231; 219/405, 411; 373/139

[56] References Cited

U.S. PATENT DOCUMENTS

| | | | |
|---|---|---|---|
| 4,097,226 | 6/1978 | Erikson et al | 432/120 |
| 4,221,956 | 9/1980 | Fielding et al. | 432/231 |
| 4,224,504 | 9/1980 | Erikson et al. | 432/231 |
| 4,371,421 | 2/1983 | Fan et al. | 156/624 |
| 4,436,985 | 3/1984 | Weber | 219/411 |
| 4,479,846 | 10/1984 | Smith et al. | 156/DIG. 88 |
| 4,535,228 | 8/1985 | Mimura et al. | 219/405 |
| 4,694,143 | 9/1987 | Nishimura et al. | 219/405 |

FOREIGN PATENT DOCUMENTS

| | | | |
|---|---|---|---|
| 2610450 | 8/1987 | France | 422/245 |

OTHER PUBLICATIONS

*J. Electrochem. Soc.;* "Zone-Melting Recrystallization of Si Films With a Moveable-Strip-Heater Oven"; by Geis et al.; Dec. 1982; pp. 2812-2818.

*Appl. Phys. Letters;* "Zone-Melting Recrystallization of 3-in.-diam Si Films on $SiO_2$-coated Si Substrates"; by Fan et al.,; vol. 41, No. 2; Jul. 1982; pp. 186-188.

*Journal of Appl. Phys.;* "Effects of Heating-Temperature Gradient and Scanning Direction on Crystallographic Properties of Zone-Melting Recrystallized Silicon on Square-Shaped Fused Quartz"; by Fujita et al.; vol. 56, No. 10; Nov. 1984; pp. 2986-2988.

*Primary Examiner*—Olik Chaudhuri
*Assistant Examiner*—Robert M. Kunemund
*Attorney, Agent, or Firm*—Hamilton, Brook, Smith & Reynolds

[57] ABSTRACT

The improved zone-melt recrystallization apparatus is comprised of a port system for providing a thermal barrier between the recrystallization chamber and the loader assembly. A bellows system is used to lift a plurality of pins that support a silicon wafer being recrystallized. Flexure supports are designed to constrain the motion of the pins within the desired direction of motion of the wafer.

10 Claims, 2 Drawing Sheets

ZONE MELT RECRYSTALLIZATION APPARATUS

BACKGROUND

This invention relates generally to the conversion of amorphous or polycrystalline semiconductor materials to substantially single crystal semiconductor material by a process known as zone-melting-recrystallization (ZMR).

From transistors to very large scale integration of complex circuitry on a single chip, the field of solid state electronics has been built largely upon the abundant nonmetallic element silicon. Large diameter single crystal boules of silicon are sliced into wafers on which dopants, insulators and conductors are applied today using a variety of processes. Over the past few years, a major effort has been devoted to developing a new silicon-based technology involving the preparation of very thin films of pure single crystal silicon on the on the order of one-half micron thick, compared to the one-half millimeter thickness of typical silicon wafers. The new technology is called silicon-on-insulator (SOI) technology because the thin silicon film is supported by an insulating substrate. An efficient, reliable and economical process for producing thin film single crystal silicon has eluded researchers until now.

In comparison to device performance in bulk silicon, SOI promises significant advantages:

(1) improved speed performance in discrete devices and circuits resulting from reduced parasitic capacitance;

(2) simplified device isolation and design layout, yielding potentially higher packing densities; and (3) radiation hard circuits for space and nuclear application.

In addition, new SOI technologies may also be utilized for three-dimensional integration of circuits.

At present, there is one mature SOI technology, silicon-on-sapphire (SOS). However, the commercial utilization of SOS has beens severely limited by its high cost, relatively poor crystalline quality, and difficulty in handling and processing in comparison to bulk Si.

Recently, a new SOI technology called zone-melting recrystallization (ZMR) based on standard silicon wafers rather than sapphire crystals has exhibited the potential for displacing SOS and for utilization on a much larger scale by the semiconductor industry. The development of ZMR has been frustrated by processing problems related to the physical chemistry of the interface between the molten silicon and adjacent silicon dioxide layers which gives rise to the so-called silicon beading phenomenon during ZMR.

SOI by the ZMR technique is produced by recrystallizing a fine-grained Si film on an insulating substrate. A typical sample structure consists of a silicon wafer coated with a 1 micron thick thermally grown $SiO_2$ insulating layer, a half micron thick polycrystalline silicon (poly-Si) layer formed by low pressure chemical vapor deposition (LPCVD), topped by a 2 micron thick layer of CVD $SiO_2$. The last layer forms a cover to encapsulate the polysilicon film constraining it while the film is being recrystallized.

SOI by the ZMR technique is described in a paper entitled "Zone Melting Recrystallization of Silicon Film With a Moveable Strip Heater Oven" by Geis et al *J. Electrochem. Soc. Solid State Science and Technology*, Vol. 129, p. 2813, 1982.

The sample is placed on a lower graphite strip and heated to a base temperature of 1100°-1300° C. in an argon gas ambient. Silicon has a melting point of about 1410° C; $SiO_2$ has a higher melting point, about 1710° C. Additional radiant energy is typically provided by a moveable upper graphite strip heater which produces localized heating of the sample along a strip to a temperature between the two melting points. Moving like a wand, the upper heater scans the molten zone across the sample leaving a recrystallized SOI film beneath the solid $SiO_2$ cap.

Existing loader assemblies for placing the wafer into the heater have a number of problems. The loading arm that transports the wafer into the ZMR chamber is subjected to excessive temperatures and thus degrades rapidly when exposed to temperatures within the chamber.

An additional system necessary for lifting the wafer off of the loader and placing it onto the heating assembly must be stable at high temperatures to insure durability and dependable manipulation of the wafer.

SUMMARY OF THE INVENTION

A baffling system is used to thermally isolate the loader assembly from the chamber in which recrystallization occurs. A preferred embodiment utilizes a rotatable cylinder positioned between the chamber and the loader such that a slot extending through the cylinder provides access to the chamber. The cylinder is rotated to an open position permitting the insertion of the loader arm, and the wafer supported by the arm, through the slot and into the chamber. When the arm is retracted, the cylinder can be rotated to a closed position whereby the slot is prevented from transmitting heat into the loader assembly space.

A further improvement comprises a system for lifting the wafer from the loader after insertion into the chamber, and for hoisting the wafer onto the loader after processing, that permits the loader to be removed from the chamber during recrystallization.

The system is comprised of at least three pins that contact the wafer during transport. These pins are mounted on a moveable platform whose motion must be precisely controlled to prevent contact with the heating elements and prevent slippage of the wafer. The plate is supported by a pair of flexure support members which are displaced from their stress free state by a pressurized bellows which moves the plate and its attached pins up during transport of the wafer.

The flexure support members provide the force necessary to compress the bellows and lower the pins when the pressure within the bellows is released.

The above, and other features of the invention including various novel details of construction and combination of parts, will now be more particularly described with reference to the accompanying drawings and pointed out in the claims. It will be understood that the particular improved zone-melt recrystallization apparatus embodying the invention is shown by way of illustration only and not as a limitation of the invention. The principal features of this invention may be employed in various embodiments without departing from the scope of the invention.

DETAILED DESCRIPTION

Figure 1:
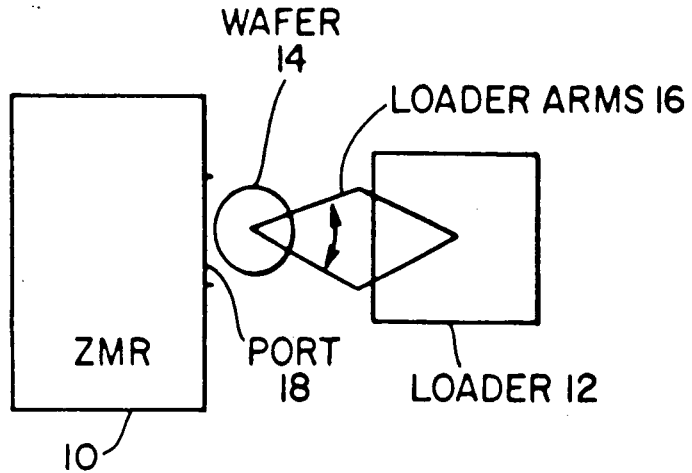
FIG. 1 is a schematic illustration of the zone-melt recrystallization and loader apparatus of the present invention.

A schematic view of the zone-melt recrystallization and loader apparatus of the present invention is shown in FIG. 1. The loader 12 is comprised of a pair of arms 16 that removes a silicon wafer 14 from a storage reservoir and transfers the wafer 14 into the chamber 10 where it is placed onto a heating element.

Figure 2:
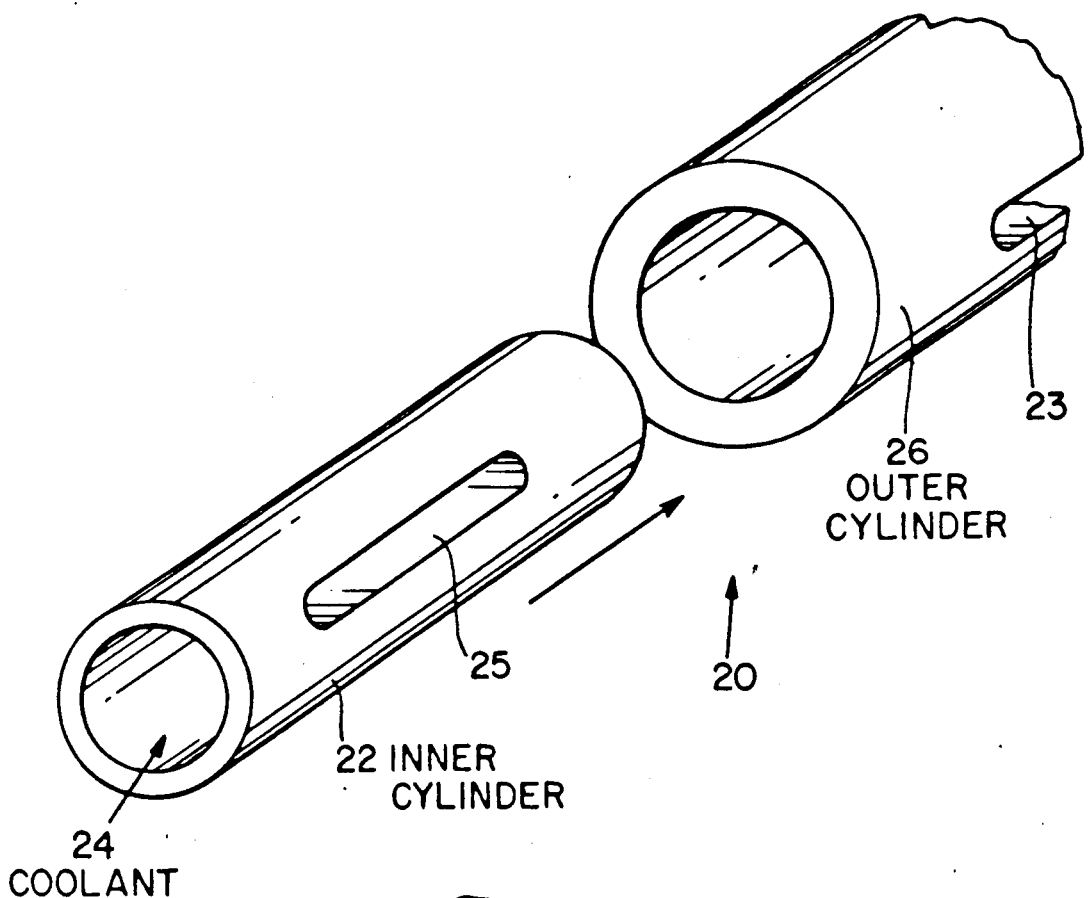
FIG. 2 is a cross-sectional view of the double cylinder loading port of the invention.

FIG. 2 is a cross-sectional view of the port apparatus 20. The port 18 can be opened to permit insertion and removal of the wafer 14, and closed during recrystallization so that the loader 12 is thermally isolated by the port apparatus 20. The port apparatus 20 is comprised of an outer cylinder 26 and an inner cylinder 26 with the latter configured within the former. The two cylinders rotate together to permit the closure of the port 18. Each cylinder has a slot 25 extending through it such that when the slots 25 are aligned, a wafer 14 on the loader arms 16 can be extended through the aligned slots 25 and into the chamber 10.

The port apparatus 20 can be attached to a cooling system such as a circulating water flow or coolant 24 passed between the inner and outer cylinders. This insures the thermal isolation of the loader 12 from the chamber 10.

Figure 3:
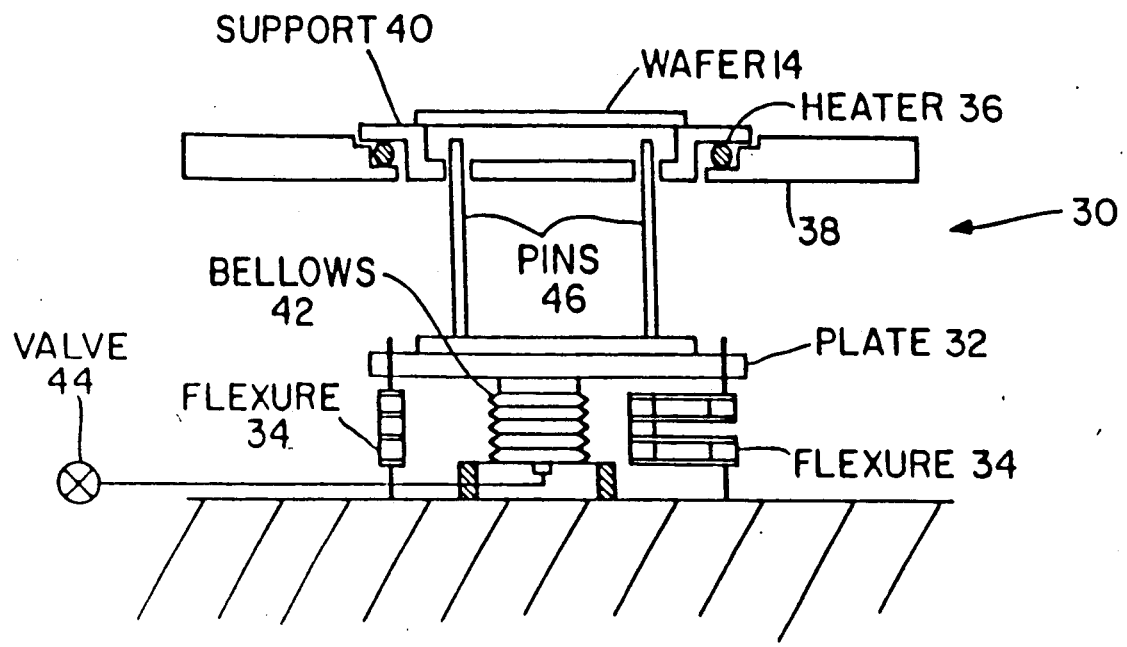
FIG. 3 is a cross-sectional view of the bellows apparatus.

FIG. 3 is a cross-sectional view of the bellows and flexure support system 30 positioned within the chamber 10. The bellows, or transport assembly, is supplied with a pressurized gas through a valve 44 to lift pins 46 that pass through the heating system to engage the wafer 14 and lift it off the peripheral support 40 so that the loader arms can transfer the wafer 14 out of the chamber 10.

Figure 4:
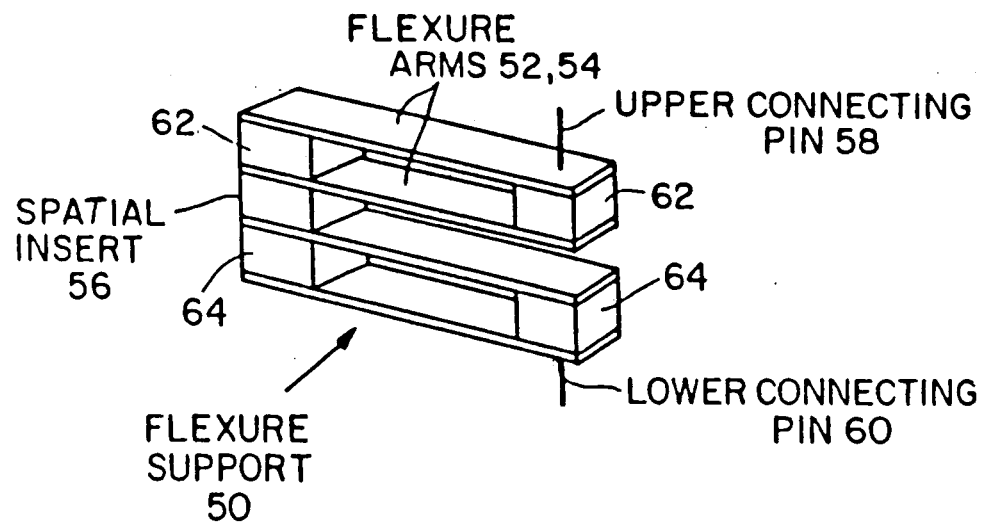
FIG. 4 is a perspective view of the flexure support design of the present invention.

There are four flexure supports 50 as shown in FIG. 4 that are used to support and stabilize each corner of the plate 32 that engages the lower ends of the pins 46. Each flexure support 50 is comprised of two pairs of flexure arms 52, 54. Each pair has two flexure arms connected at both ends by spatial inserts 62, 64. Each pair is then connected at one far end by a spatial insert 15. The far end is on the end of the flexure support 50 opposite the end at which the support 50 is mounted onto the bellows apparatus by upper and lower connecting pins 58, 60.

This pin lifter must be stable at high temperatures as it never leaves the ZMR chamber. The pins 46 must not perturb the temperature profile of the wafer 14 so that recrystallization is not uneven. The pins 46 must move through the heater 36 without touching the heater elements. These pins 46 can be comprised of small diameter quartz rods. The pins 46 are mounted on a tantalum plate 32.

The flexure support system acts as a frictionless bearing and guide for the motion of the tantalum plate 32 which supports the attached pins 46. The upper and lower pairs of flexure arms 52, 54 being about the central spatial insert 56 and provide a small resistance to the upper and lower movement of the pins 46. The flexure supports 50 provide a very stiff resistance to motion in the plane of the tantalum plate 32. Thus the flexure supports 50 are designed to prevent translation or rotation in the plane perpendicular to the up and down motion of the pins 46.

A preferred embodiment utilizes of a pair of flexure supports 50 mounted on the same set of connecting pins 58, 60 at a 90° angle. This embodiment operates to more effectively prevent rotation of the plate 32.

We claim:

1. Apparatus for transporting a semiconductor material within a chamber for recrystallization of the material comprising:
    a plurality of at least three pins for supporting a semiconductor material during movement of the material along an axis relative to a heating element;
    a movable support on which the pins are mounted;
    a stationary peripheral support upon which the pins place the material for recrystallization;
    a pin lifter for raising and lowering a portion of the pins above and below the peripheral support; and
    a flexure support secured to the movable support and positioned within the chamber, the flexure support being flexible along the axis of movement and stiff in the plane orthogonal to the axis to maintain the motion of the pins along the axis.

2. The apparatus of claim 1 wherein said pins comprise quartz rods.

3. The apparatus of claim 1 wherein said movable support comprises tantalum.

4. The apparatus of claim 1 wherein said lifter comprises a bellows which are actuated by a high pressure gas flow.

5. The apparatus of claim 1 wherein said flexure support comprises a pair of flexible members attached at one end by a spatial insert such that one member is connected at the opposite end to the moveable support, and the other member is connected to a stationary support surface.

6. The apparatus of claim 5 wherein said flexure support operates without substantial movement between contacting components of the flexure support.

7. The apparatus of claim 5 wherein said pair of arms is mounted with a second pair of arms configured at a 90° angle from said first pair of arms.

8. The apparatus of claim 5 wherein each arm is comprised of a pair of flexible members connected at both ends by a spatial insert.

9. The apparatus of claim 1 further comprising a loader arm insertable into the chamber to insert or retrieve the material supported by the pins.

10. The apparatus of claim 1 wherein the flexure support comprises a flexible armature that bends upon actuation of the transport assembly.

* * * * *